(12) United States Patent
Chang et al.

(10) Patent No.: US 9,418,964 B2
(45) Date of Patent: Aug. 16, 2016

(54) CHIP PACKAGE STRUCTURE

(75) Inventors: Wen-Yuan Chang, New Taipei (TW); Yeh-Chi Hsu, New Taipei (TW); Wei-Chih Lai, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 11 days.

(21) Appl. No.: 13/429,441

(22) Filed: Mar. 26, 2012

(65) Prior Publication Data

US 2013/0175681 A1 Jul. 11, 2013

(30) Foreign Application Priority Data

Jan. 5, 2012 (TW) .............................. 101100472 A

(51) Int. Cl.
*H01L 23/48* (2006.01)
*H01L 25/065* (2006.01)
*H01L 23/31* (2006.01)
*H01L 23/00* (2006.01)
*H01L 25/18* (2006.01)

(52) U.S. Cl.
CPC ............ *H01L 25/0652* (2013.01); *H01L 24/49* (2013.01); *H01L 25/0655* (2013.01); *H01L 23/3121* (2013.01); *H01L 24/16* (2013.01); *H01L 24/48* (2013.01); *H01L 24/73* (2013.01); *H01L 25/18* (2013.01); *H01L 2224/05554* (2013.01); *H01L 2224/13147* (2013.01); *H01L 2224/16145* (2013.01); *H01L 2224/16225* (2013.01); *H01L 2224/32145* (2013.01); *H01L 2224/32225* (2013.01); *H01L 2224/48111* (2013.01); *H01L 2224/48145* (2013.01); *H01L 2224/48175* (2013.01); *H01L 2224/48227* (2013.01); *H01L 2224/4911* (2013.01); *H01L 2224/73265* (2013.01); *H01L 2225/0651* (2013.01); *H01L 2225/06506* (2013.01); *H01L 2225/06558* (2013.01); *H01L 2225/06562* (2013.01); *H01L 2924/00014* (2013.01); *H01L 2924/10253* (2013.01); *H01L 2924/14* (2013.01); *H01L 2924/181* (2013.01)

(58) Field of Classification Search
USPC .......................................... 257/441, 686, 777
See application file for complete search history.

(56) References Cited

U.S. PATENT DOCUMENTS

| | | | | |
|---|---|---|---|---|
| 7,132,753 | B1 * | 11/2006 | St. Amand et al. ............ | 257/777 |
| 7,816,771 | B2 * | 10/2010 | Shen .................. | H01L 23/49531 257/666 |
| 8,399,992 | B2 * | 3/2013 | Park ..................... | H01L 23/3128 257/678 |
| 2003/0137042 | A1 * | 7/2003 | Mess et al. ..................... | 257/686 |
| 2003/0183917 | A1 * | 10/2003 | Tsai et al. ..................... | 257/686 |
| 2011/0084396 | A1 * | 4/2011 | Lee ........................ | H01L 23/522 257/773 |

FOREIGN PATENT DOCUMENTS

TW 201101459 1/2011

OTHER PUBLICATIONS

"Office Action of Taiwan Counterpart Application," issued on Dec. 23, 2014, p. 1-p. 10.

* cited by examiner

*Primary Examiner* — Mark Tornow
*Assistant Examiner* — Priya Rampersaud
(74) *Attorney, Agent, or Firm* — Jianq Chyun IP Office

(57) ABSTRACT

A chip package structure includes a carrier and a chip group. The chip group includes a pair of first chips that are identical IC chips. The pair of first chips are disposed on the carrier in opposite directions and parallel to each other, and electrically connected with the carrier.

18 Claims, 7 Drawing Sheets

US 9,418,964 B2

1

CHIP PACKAGE STRUCTURE

CROSS-REFERENCE TO RELATED APPLICATION

This application claims the priority benefit of Taiwan application serial no. 101100472, filed on Jan. 5, 2012. The entirety of the above-mentioned patent application is hereby incorporated by reference herein and made a part of this specification.

BACKGROUND OF THE INVENTION

1. Field of the Invention

The present invention relates to a chip package structure, especially to a multi-chip package structure.

2. Description of Related Art

Semiconductor integrated circuit (IC) industry substantially includes integrated circuit fabricating and integrated circuit packaging. The integrated circuit fabricating indicates that fabricating the integrated circuits on a wafer. And the integrated circuit packaging can provide functions of structure protection, electrical transmission and good heat dissipation to the die (a part of the wafer after wafer cutting) on which IC has been fabricated thereon.

In general, the integrated circuit packaging is to carry out fabricating process to a single die, i.e., packaging a single die is commonly seen. However, a plurality of dies (multi-chip) has to be packaged on a single carrier according to some requirements. Thus, how to arrange those dies (multi-chip) is very important for decreasing the dimension of the package structure.

SUMMARY OF THE INVENTION

The present invention relates to a chip package structure used for multi-chip packaging.

The present invention provides a chip package structure including a carrier and a chip group. The chip group includes a pair of chips and they are identical integrated circuit (IC) chips. The pair of chips are disposed on the carrier in opposite directions and parallel to each other and electrically connected to the carrier.

In light of the above, in the present invention, in order to provide a method for packaging multi-chip, a pair of identical chips is disposed on the carrier in opposite directions and parallel to each other.

In order to make the aforementioned and other features and advantages of the disclosure more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

2

Figure 4:
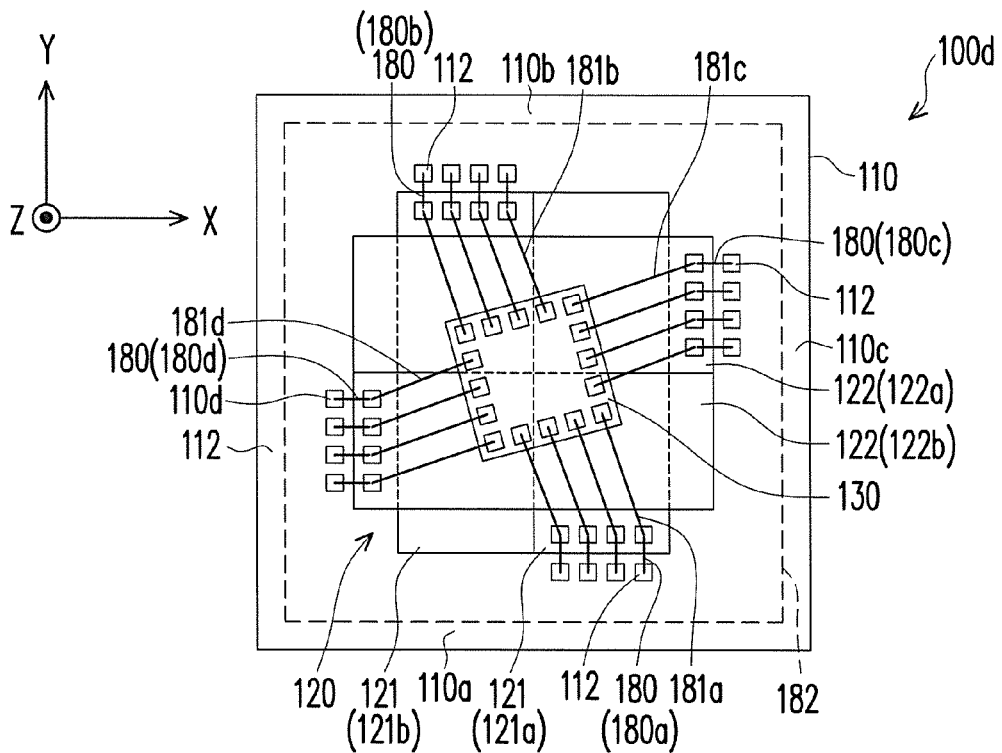

FIG. 4 is a schematic top view illustrating a chip package structure according to another embodiment of the present invention.

Figure 5:
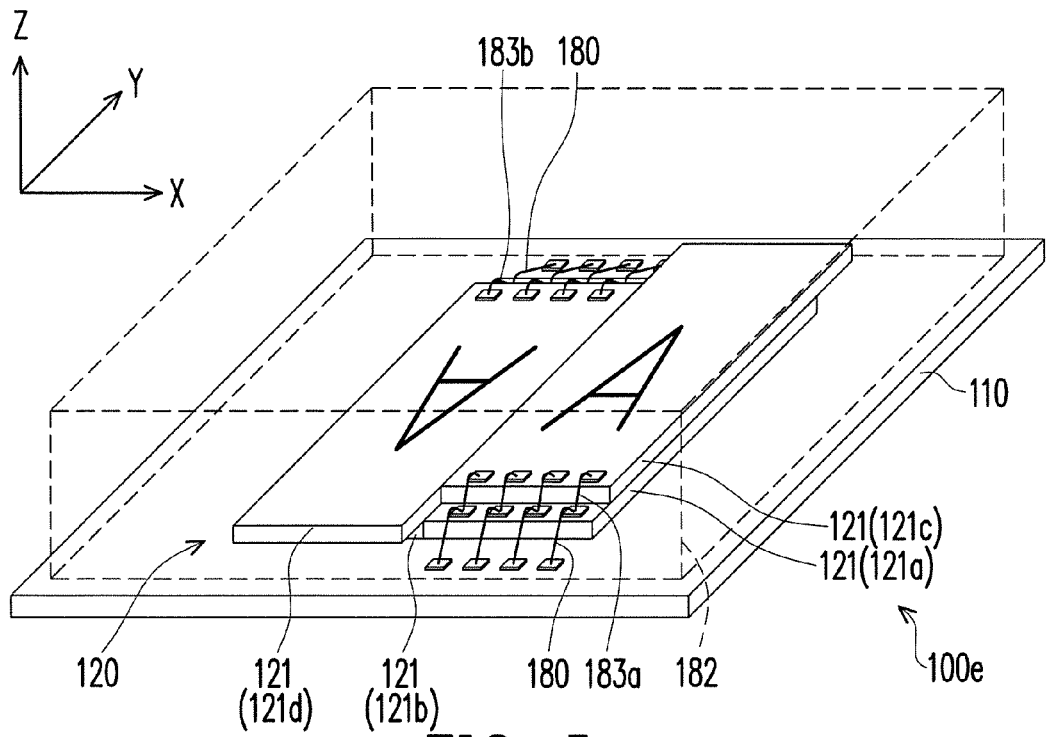

FIG. 5 is a schematic three-dimensional view illustrating a chip package structure according to another embodiment of the present invention.

Figure 6:
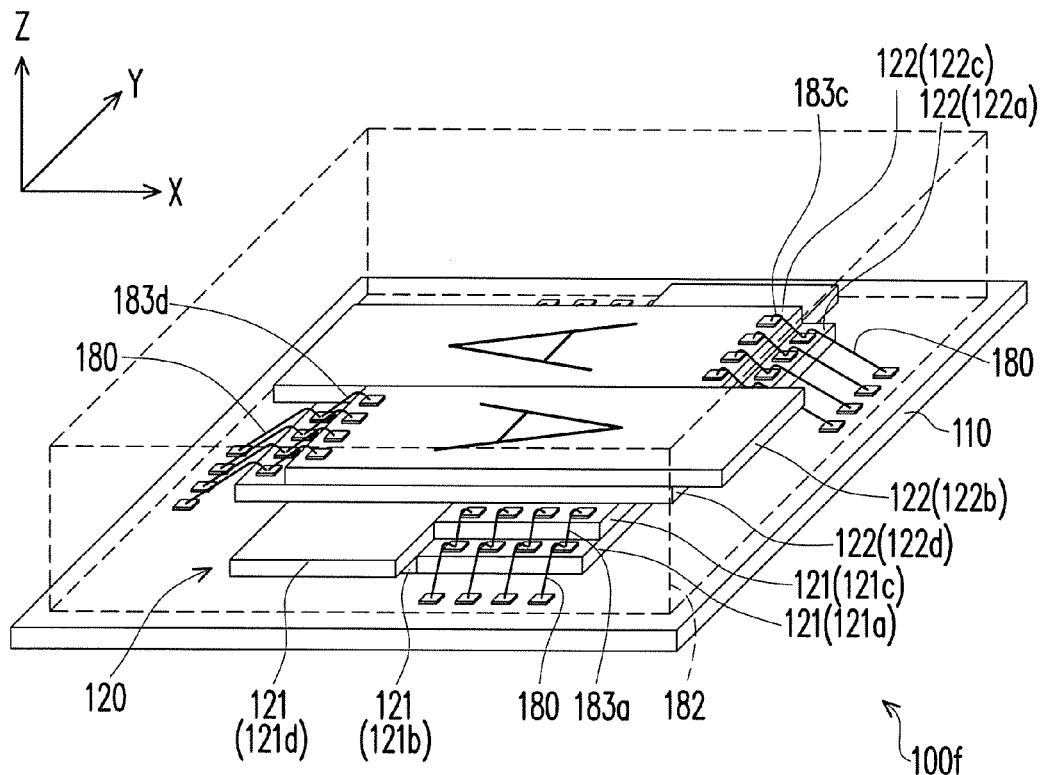

FIG. 6 is a schematic three-dimensional view illustrating a chip package structure according to another embodiment of the present invention.

Figure 7:
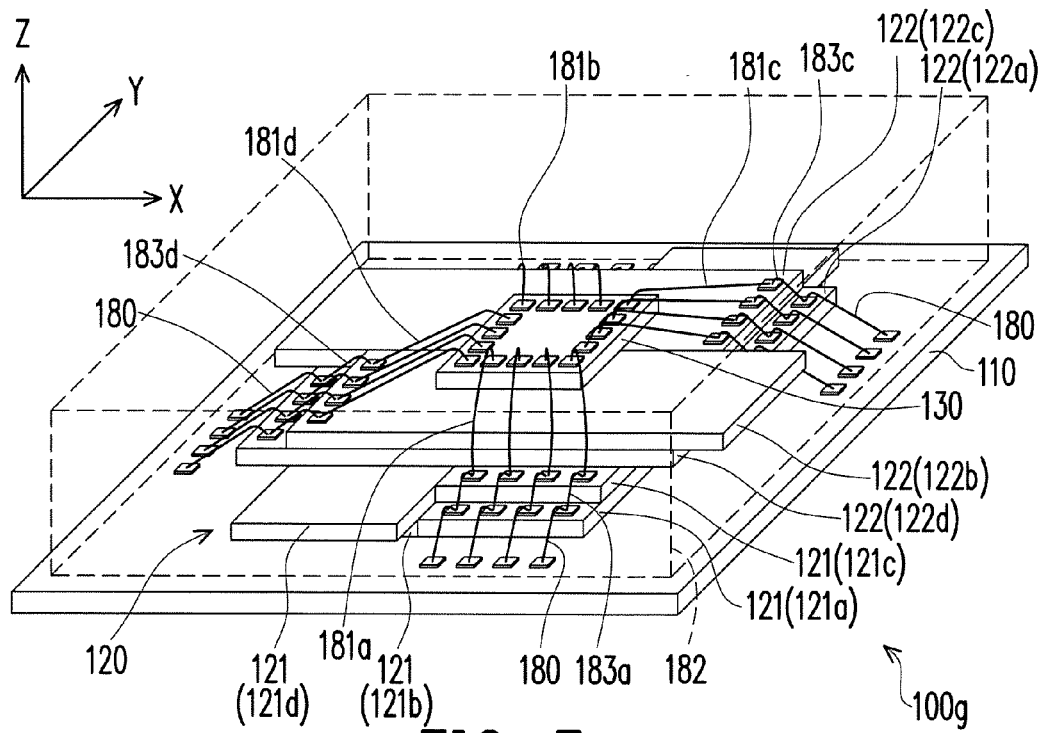

FIG. 7 is a schematic three-dimensional view illustrating a chip package structure according to another embodiment of the present invention.

Figure 8:
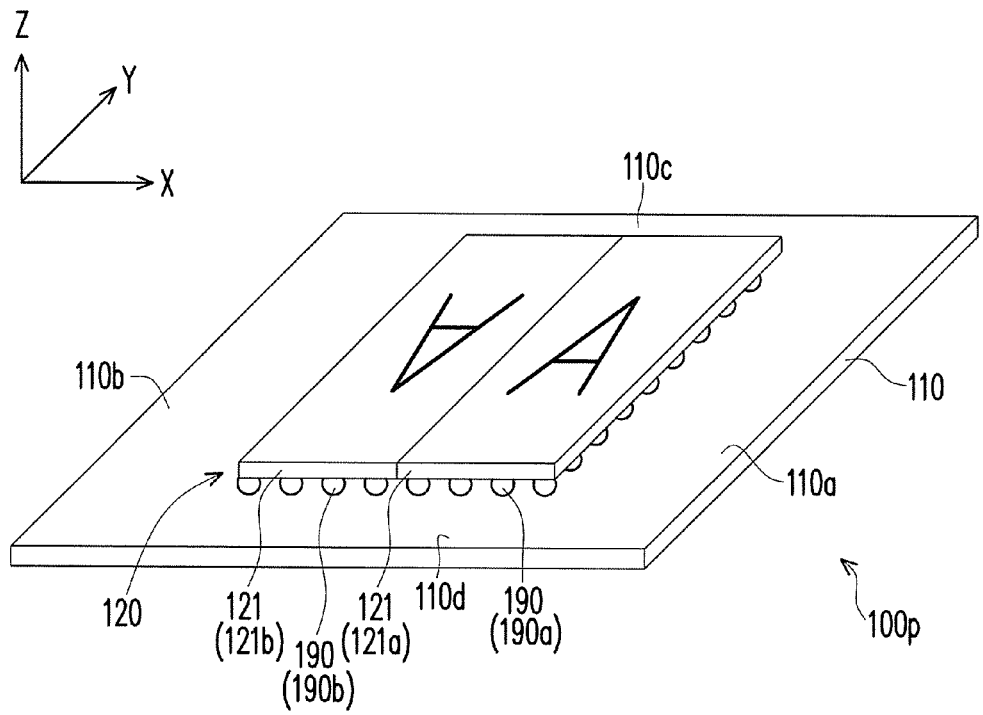

FIG. 8 is a schematic three-dimensional view illustrating a chip package structure according to another embodiment of the present invention.

Figure 9:
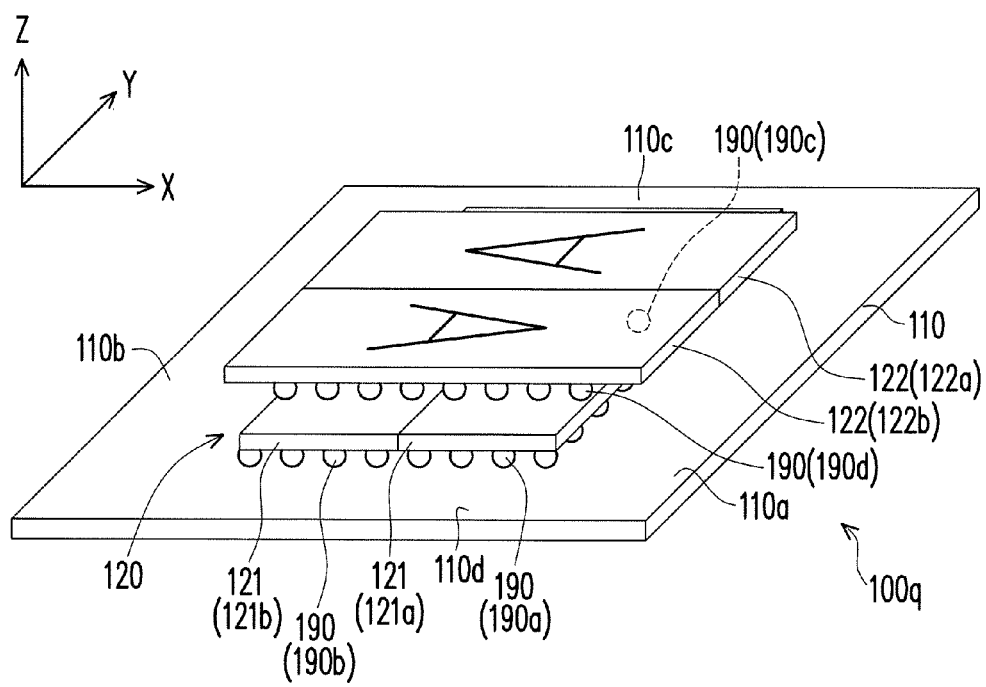

FIG. 9 is a schematic three-dimensional view illustrating a chip package structure according to another embodiment of the present invention.

Figure 10:
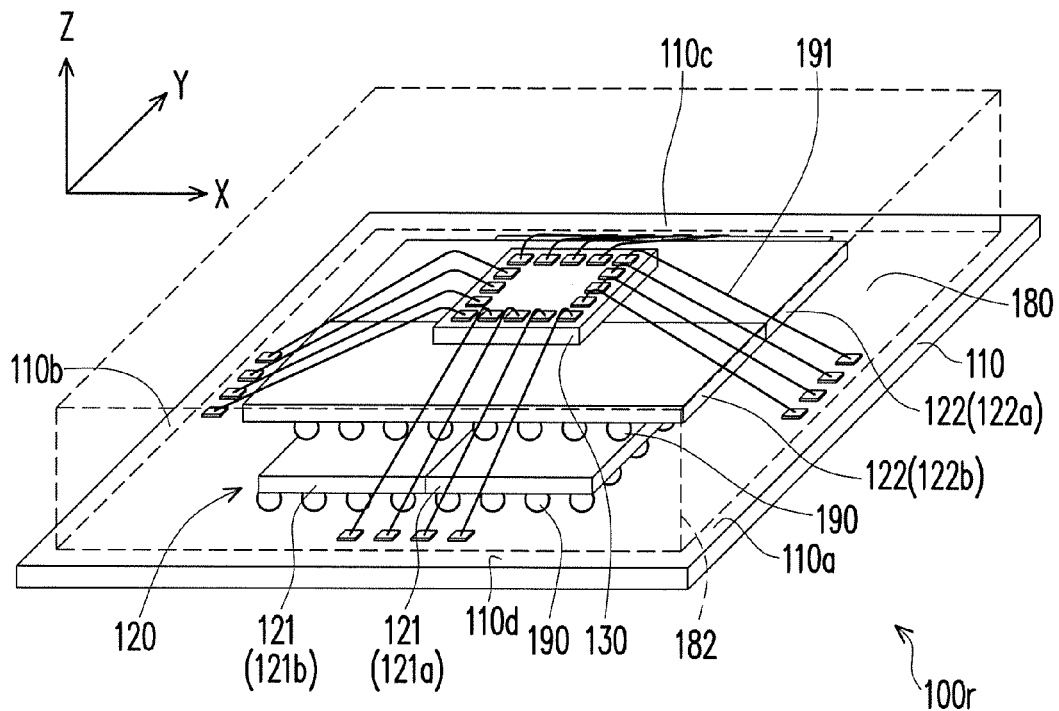

FIG. 10 is a schematic three-dimensional view illustrating a chip package structure according to another embodiment of the present invention.

Figure 11:
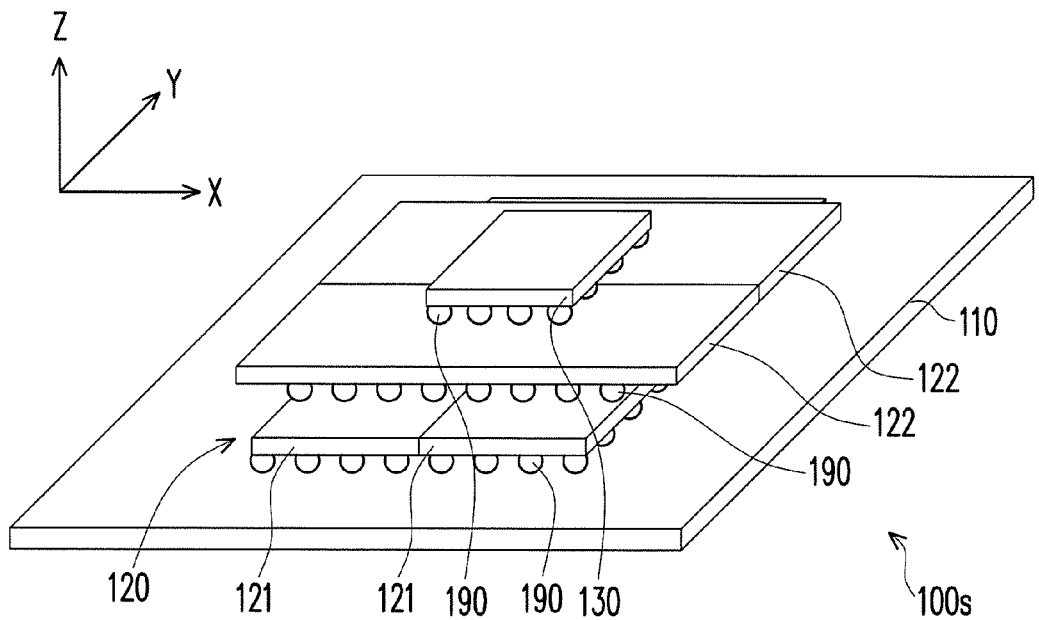

FIG. 11 is a schematic three-dimensional view illustrating a chip package structure according to another embodiment of the present invention.

Figure 12:
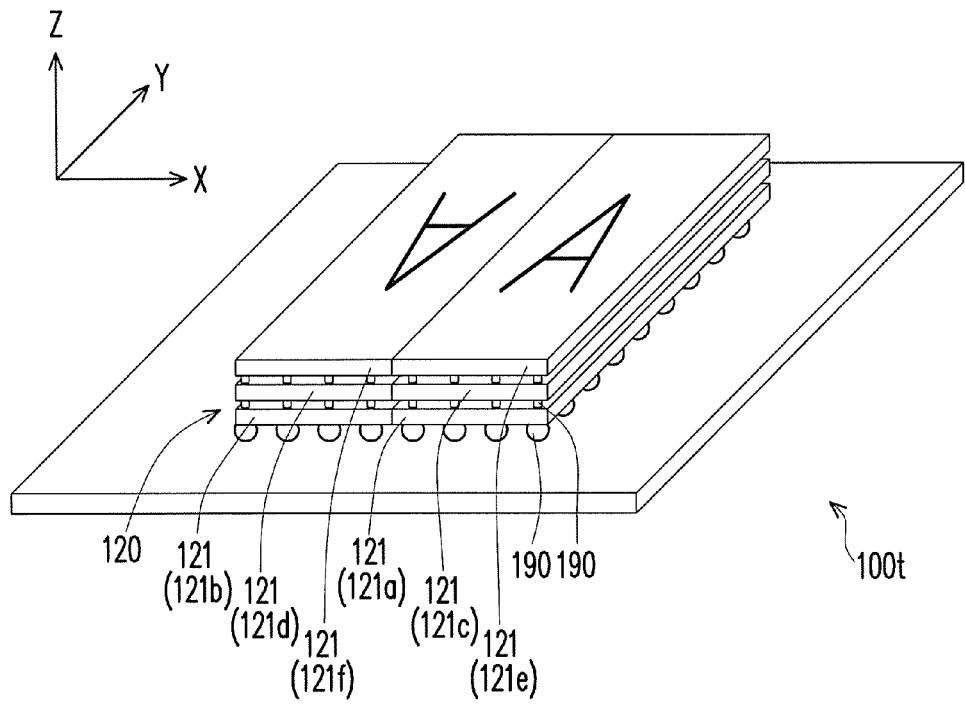

FIG. 12 is a schematic three-dimensional view illustrating a chip package structure according to another embodiment of the present invention.

Figure 13:
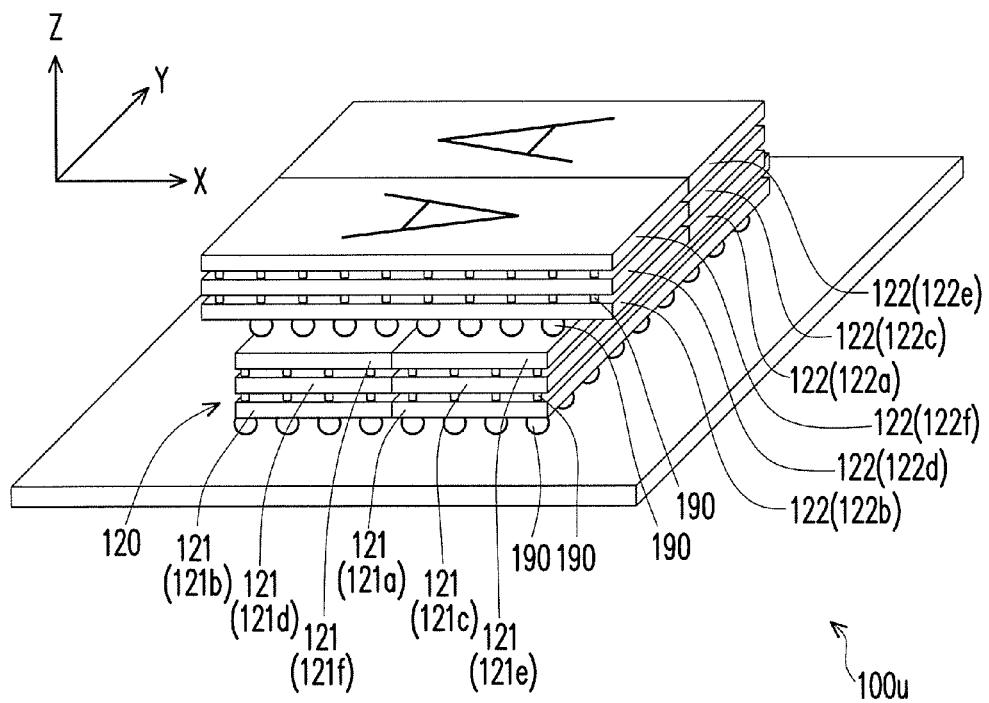

FIG. 13 is a schematic three-dimensional view illustrating a chip package structure according to another embodiment of the present invention.

DESCRIPTION OF EMBODIMENTS

Figure 1:
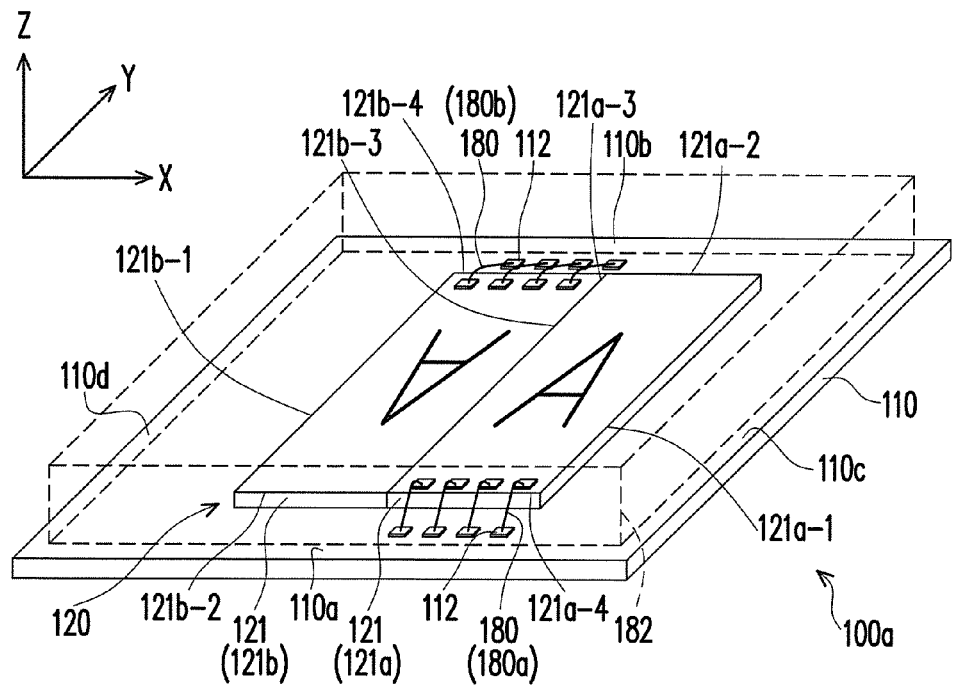
FIG. 1 is a schematic three-dimensional view illustrating a chip package structure according to an embodiment of the present invention.

FIG. 1 is a schematic three-dimensional view illustrating a chip package structure according to an embodiment of the present invention. Referring to FIG. 1, the chip package structure 100a of the present embodiment includes a carrier 110 and a chip group 120. In the embodiment, the chip group 120 includes a pair of first chips 121. The first chips 121 are identical IC chips having the same electrical functions, the same dimensions and the same integrated circuits, for example. The pair of first chips 121 is disposed on the carrier 110 in opposite directions and is electrically connected to the carrier 110. The longitudinal directions of the pair of first chips 121 are parallel to the Y axis, but one of the pair of first chips 121 rotates 180 degrees relative to the other first chip 121 and aligned side by side to the other first chip 121.

In order to clearly describe the pair of identical chips arranged side by side and in opposite directions on the carrier 110, a capital letter "A" is illustrated the longitudinal direction of each of the first chips 121 in FIG. 1. According to the directions of the capital letter "A", the pair of first chips 121 include the normal chip 121a located at the right side of FIG. 1 toward the positive direction of Y axis and the reverse chip 121b located at the left side of FIG. 1 toward the negative direction of Y axis. In detail as shown in FIG. 1. The normal chip 121a has a first end 121a-1, a second end 121a-2, a third end 121a-3 and a fourth end 121a-4. The first end 121a-1 and the third end 121a-3 are opposite; while the second end 121a-2 and the fourth end 121a-4 are opposite. The reverse chip 121b has a first end 121b-1, a second end 121b-2, a third end 121b-3 and a fourth end 121b-4. The first end 121b-1 and the third end 121b-3 are opposite; while the second end 121b-2 and the fourth end 121b-4 are opposite. Furthermore, the third end 121a-3 of the normal chip 121a and the third end 121b-3 of the reverse chip 121b are adjacent. The second end 121a-2 of the normal chip 121a and the second end 121b-2 of the reverse chip 121b are located at two opposite ends of the identical chips 121 arranged side by side in the plane respectively.

In the embodiment, the pair of first chips 121 is chips with the same functions, for example, memory chips. In addition, the pair of first chips 121 is electrically connected to the carrier 110 by wire bonding technology. In other words, the first chips 121 are electrically connected to the carrier 110 through a plurality of conductive wires 180. The conductive wires 180 are encapsulated by the encapsulant 182. More specifically, the conductive wires 180 include a plurality of first conductive wires 180a and a plurality of second conductive wires 180b. The first conductive wires 180a are electrically connected to the normal chip 121a and the carrier 110, and the second conductive wires 180b are electrically connected to the reverse chip 121b and the carrier 110. The orthogonal projection of the first conductive wires 180a onto the carrier 110 is located at a first side 110a of the carrier 110, and the orthogonal projection of the second conductive wires 180b onto the carrier 110 is located at a second side 110b opposite to the first side 110a of the carrier 110. The first conductive wires 180a and the second conductive wires 180b may transmit signals with the same transmission protocol.

Since the pair of first chips 121 (i.e., the normal chip 121a and the reverse chip 121b) disposed in parallel but in opposite directions, the pads 112 electrically connecting to the conductive wires 180, like the signal pads electrically connecting to the signal wires, would be distributed on different sides of the carrier 110. Accordingly, the space over the carrier 110 can be more effectively used. In addition, the length of each of the conductive wires 180 of the present embodiment is comparatively short, thus signal delay, coupling effect, power consumption, the thickness of the whole package and the like can be reduced. In the embodiment of the present invention, the pads 112 are located at the fourth end 121a-4 of the normal chip 121a, while the pads 112 are located at the fourth end 121b-4 of the reverse chip 121b. It means the pads 112 are located at the same one end (such as the fourth end) of each corresponding identical chip 121.

Figure 2:
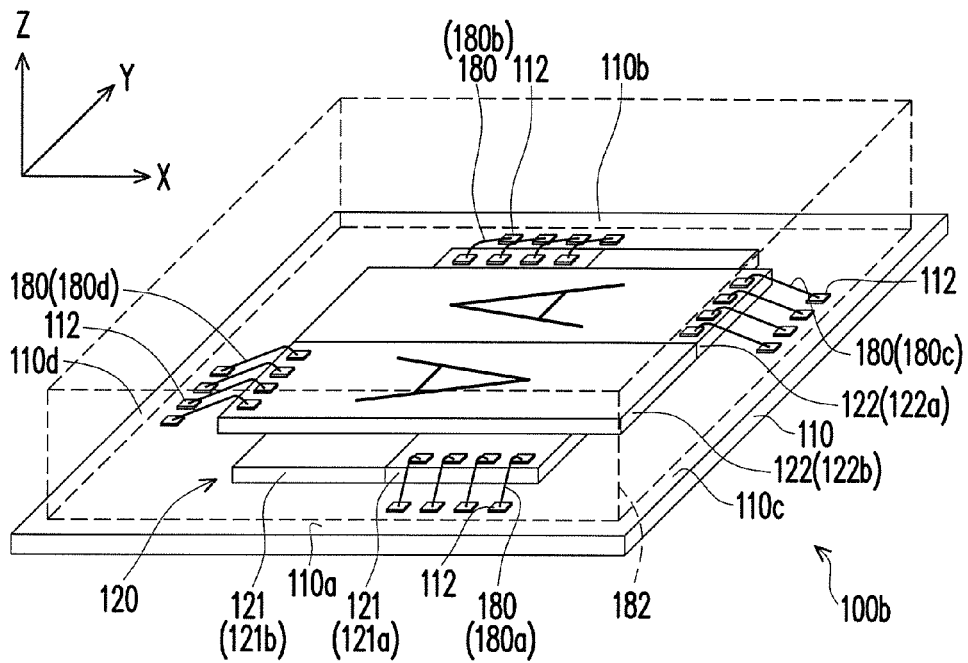
FIG. 2 is a schematic three-dimensional view illustrating a chip package structure according to another embodiment of the present invention.

FIG. 2 is a schematic three-dimensional view illustrating a chip package structure according to another embodiment of the present invention. Cooperating to the embodiment of FIG. 1, the chip group 120 of the chip package structure 100b of the present embodiment in FIG. 2 further includes a pair of second chips 122. The pair of second chips 122 and the pair of first chips 121 are identical IC chips. One of the pair of second chips 122 is disposed in parallel to the other. And, the second chips 122 are disposed on the first chips 121 and are electrically connected to the carrier 110. The longitudinal direction of the first chips is not parallel to that of the second chips. In this embodiment, the longitudinal direction of the pair of first chips 121 is parallel to the Y axis, and the longitudinal direction of the pair of second chips 122 is parallel to the X axis. The longitudinal direction of the first chips and that of the second chips are orthogonal to each other.

Similarly, in order to clearly describe the pair of second chips 122 arranged side by side and in opposite directions, a capital letter "A" is illustrated the longitudinal direction of each second chip 122. According to the directions of the capital letter "A", one of the pair of second chips 122a located at the upper side of FIG. 2 toward to the negative direction of the X axis, and the other chip 122b located at the lower side of FIG. 2 toward to the positive direction of the X axis.

In the embodiment, the pair of first chips 121 and the pair of second chips 122 are chips with the same functions, for example, memory chips. Similarly, the pair of second chips 122 is electrically connected to the carrier 110 by wire bonding technology. In other words, the pair of second chips 122 is also electrically connected to the carrier 110 through a plurality of conductive wires 180 and the conductive wires 180 are encapsulated by the encapsulant 182.

More specifically, the conductive wires 180 include a plurality of first conductive wires 180a, a plurality of second conductive wires 180b, a plurality of third conductive wires 180c, and a plurality of fourth conductive wires 180d. The first conductive wires 180a and the second conductive wires 180b connect one of the first chips 121 and the carrier 110. The first conductive wires 180a are located in a first side 110a, and the second conductive wires 180b are located in a second side 110b. The third conductive wires 180c are electrically connected to the chip 122a and the carrier 110, and the fourth conductive wires 180d are electrically connected to the chip 122b and the carrier 110. The orthogonal projection of the third conductive wires 180c onto the carrier 110 is located at a third side 110c of the carrier 110, and the orthogonal projection of the fourth conductive wires 180d onto the carrier 110 is located at a fourth side 110d of the carrier 110. The first side 110a is opposite to the second side 110b. The third side 110c is adjacent to an end of the first side 110a, and the fourth side 110d is adjacent to the other end of the first side 110a. The first conductive wires 180a, the second conductive wires 180b, the third conductive wires 180c and the fourth conductive wires 180d may transmit signals with the same transmission protocol.

Since the arrangement of the pair of first chips and the pair of the second chips are in parallel and in different directions, the pads 112 would be distributed on different sides of the carrier 110 for electrically connecting the first chips 121 and the second chips 122 through the conductive wires 180. Accordingly, the space over the carrier 110 can be more effectively used. In addition, the length of each of the conductive wires 180 connecting the first chips 121 and the second chips 122 to the carrier 110 can be comparatively short, thus signal delay, coupling effect, power consumption, and the thickness of the whole package, and the like can be reduced.

Figure 3A:
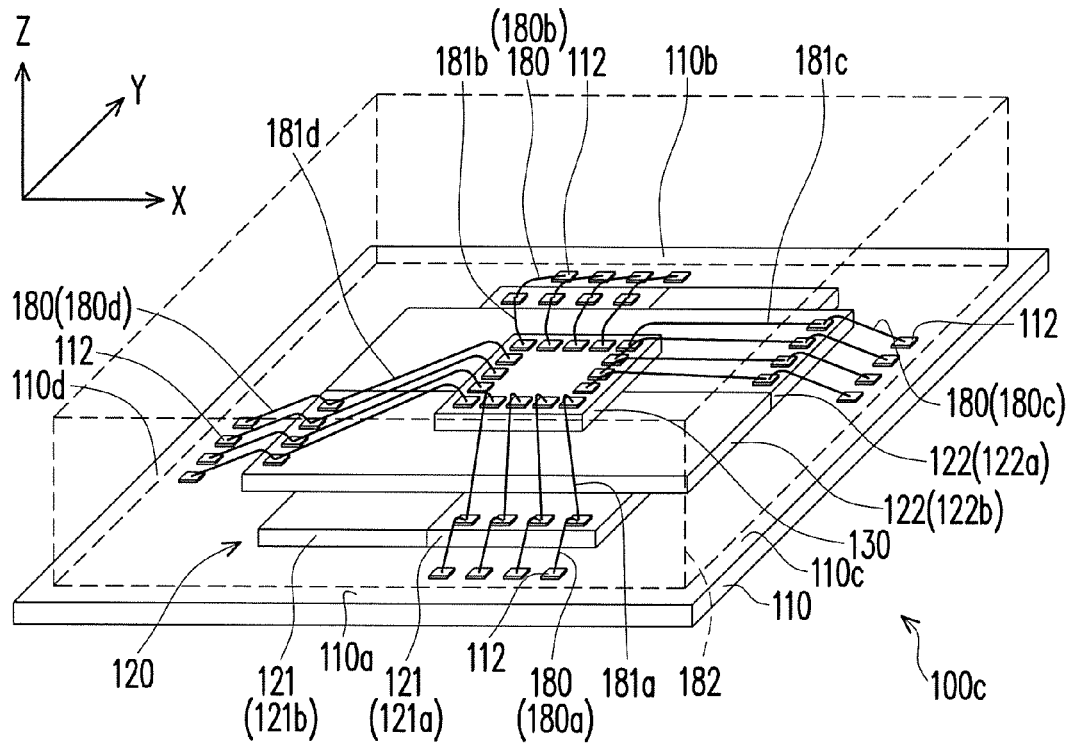
FIG. 3A and FIG. 3B are schematic three-dimensional view and top view respectively illustrating a chip package structure according to another embodiment of the present invention.
Figure 3B:
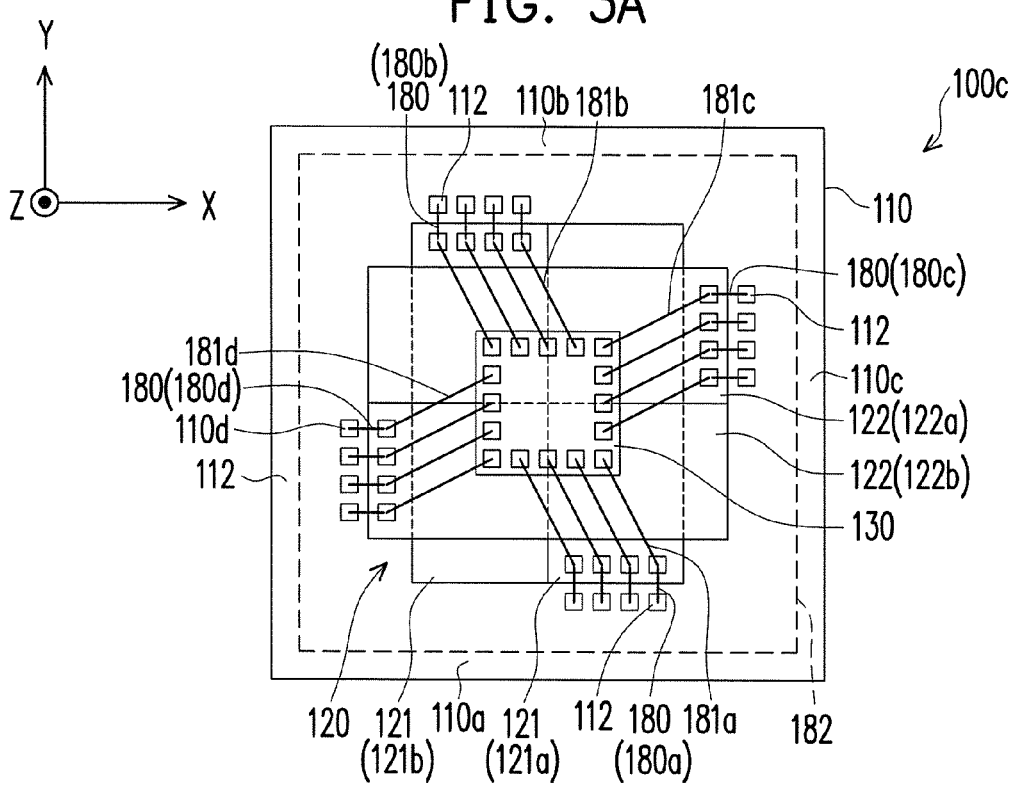

FIG. 3A and FIG. 3B are schematic three-dimensional view and top view respectively illustrating a chip package structure according to another embodiment of the present invention. Referring to FIG. 3A and FIG. 3B and cooperating with the embodiments of FIG. 2 and FIG. 1, the chip group 120 of the chip package structure 100c of the present embodiment further includes a top chip 130. The top chip 130 is disposed on the chip group 120 and electrically connected to the chip group 120. Specifically, the top chip 130 is disposed on the pair of second chips 122 of the chip group 120 and electrically connected to the first chips 121 and the second chips 122 of the chip group 120 through the conductive wires 181. The first chips 121 and the second chips 122 further directly and electrically connect to the carrier 110 through the conductive wires 180. Thus, the top chip 130 electrically connects to the carrier 110. Additionally but not shown in the drawings, the top chip 130 is capable to directly and electrically connect to the carrier 110 through the conductive wires.

In the embodiment, the pair of first chips 121 and the pair of second chips 122 are chips with the same functions, for example, memory chips, and the top chip 130 is a chip with the capability to control/access the memory chips. Moreover, the top chip 130 can be electrically connected to the pair of first chips 121 and the pair of second chips 122 by wire bonding technology. Specifically, the top chip 130 is electrically connected to the normal chip 121a, the reverse chip 121b, the normal chip 122a, and the reverse chip 122b through the conductive wires 181a, the conductive wires 181*b*, the conductive wires 181*c* and the conductive wires 181*d* respectively. In addition, through the arrangement of the pair of first chips 121 (i.e., the normal chip 121*a* and the reverse chip 121*b*) and the pair of second chips 122 (i.e., the second normal chip 122*a* and the second reverse chip 122*b*) toward to different directions, the pads 112 distributed on different sides of the carrier 130 would electrically connect to the first chips 121 and the second chips 122 respectively. Accordingly, the space over the top chip 130 can be more effectively used. In addition, the length of each of the conductive wires 181*a* to 181*d* connecting the top chip 130 to the first chips 121 and the second chips 122 can be comparatively short, thus signal delay, coupling effect, power consumption and the like can be reduced.

FIG. 4 is a schematic top view illustrating a chip package structure according to another embodiment of the present invention. Referring to FIG. 4, compared to the embodiment of FIG. 3B, the orthogonal projection of the top chip 130 of the chip package structure 100*d* onto the carrier 110 is in a different direction, neither in parallel to the longitudinal direction of the pair of first chips 121 (Y axis) nor in parallel to the longitudinal direction of the second chips 122 (X axis). Along the direction upward from the carrier 110, the top chip 130 is rotated or shifted an angle to the first chips and the second chips. In other words, the direction of the top chip 130 and the direction of the pair of first chips 121 are neither parallel nor orthogonal to each other in the viewpoint of the Z axis.

In the embodiment, similar to the embodiment of FIG. 3B, the top chip 130 of FIG. 4 can be electrically connected to the pair of first chips 121 and the pair of second chips 122 by wire bonding technology. It should to be noted that, due to the arrangement of the first chips 121 and the second chips 122 in opposition directions, the thickness and dimension of the package structure can be reduced from the benefit of short length of conductive length, the lengths of the conductive wires 181*a* to 181*d* can also be optimized to reduce the signal delay, coupling effect, power consumption. It has to be noted that, the layout of the top chip 130 connecting to the pair of first chips 121 and the pair of second chips 122 is disposed symmetrically, thus the timing skew due to the conductive wires can be reduced. By using general manufacturing technique in the related field, the timing skew of the signals can be controlled within the tolerance.

According to the embodiments of FIG. 3B and FIG. 4, the lengths of the corresponding conductive wires 181*a*~181*d* located in the different sides of the top chip 130 can be optimized for the electrical performance by adjusting the location and angular position of the top chip 130 above the carrier 110. For example, lengths of the conductive wires 181*a* to 181*d* located at the corners, like the upper left corner or the lower right corner, of the top chip 130 are equal to that of the other conductive wires 181*a*~181*d*.

FIG. 5 is a schematic three-dimensional view illustrating a chip package structure according to another embodiment of the present invention. Referring to FIG. 5 and further cooperating with the embodiment of FIG. 1, the chip group 120 of the chip package structure 100*e* of the present embodiment further includes a plurality of pairs of first chips 121 stacked on the carrier 110. In the embodiment, one chip of the pair of the first chips 121 is stacked on and electrically connected to one of another pair, and the other chips of the pairs of the first chips 121 are also stacked on and electrically connected. The two stacks of the first chips 121 are adjacent to each other and electrically connected to the carrier 110.

Specifically, one pair of first chips 121 includes the normal chip 121*a*, and the reverse chip 121*b*, and another pair of first chips 121 includes the normal chip 121*c* and the reverse chip 121*d*. The normal chip 121*a* is adjacent to the reverse chip 121*b*, and the normal chip 121*c* is adjacent to the reverse chip 121*d*. Further, the normal chips 121*a* and 121*c* are stacked together, and the reverse chips 121*b* and 121*d* are stacked together. In addition, the normal chips 121*a* and 121*c* are connected to each other through the conductive wires 183*a* and are further connected to the carrier 110 through the conductive wires 180. Similarly, the reverse chips 121*b* and 121*d* are connected to each other through the conductive wires 183*b* and are further connected to the carrier 110 through the conductive wires 180.

FIG. 6 is a schematic three-dimensional view illustrating a chip package structure according to another embodiment of the present invention. Referring to FIG. 6 and further cooperating to the embodiment of FIG. 5, the chip group 120 of the chip package structure 100*f* of the present embodiment further includes a plurality of pairs of second chips 122 in two stacks on the pairs of first chips 121. One of the pair of second chips 122 is stacked on and electrically connected to one of another pair of second chips 122, and the other chips of the pairs of second chips 122 are also stacked and electrically connected. In the embodiment, the two stacks of the second chips 122 are adjacent to each other, and each stack is electrically connected by wire bonding technology.

Specifically, one pair of second chips 122 includes the normal chip 122*a*, and the reverse chip 122*b*, and another pair of second chips 122 includes the normal chip 122*c* and the reverse chip 122*d*. The normal chip 122*a* and the normal chip 122*c* are stacked together, and the reverse chip 122*b* and the reverse chip 122*d* are stacked together. The two stacks are adjacent to each other and in opposite directions. In addition, the normal chip 122*a* and the normal chip 122*c* are connected to each other through the conductive wires 183*c* and are further connected to the carrier through the conductive wires 180. Similarly, the reverse chip 122*b* and the reverse chip 122*d* are connected to each other through the conductive wires 183*d* and are further connected to the carrier 110 through the conductive wires 180.

FIG. 7 is a schematic three-dimensional view illustrating a chip package structure according to another embodiment of the present invention. Cooperating to the embodiment of FIG. 6, the chip group 120 of the chip package structure 100*g* of the present embodiment in FIG. 7 further includes a top chip 130. The top chip 130 is disposed on the chip group 120 and is electrically connected to the chip group 120. Specifically, the top chip 130 is disposed on the pair of second chips 122 and is electrically connected to the pair of first chips 121 and the pair of second chips 122. In the embodiment, the top chip 130 can be electrically connected to the pair of first chips 121 and the pair of second chips 122 by wire bonding technology. Although it is not shown in the drawings, parts of connecting points the top chip 130 would be further directly and electrically connected to the carrier 110 through the conductive wires.

It should to be noted that, the thickness and dimension of the package structure can be reduced due to the arrangement of the pair of first chips 121 and the pair of second chips 122. And, the lengths of the conductive wires 181*a* to 181*d* can also be adjusted, so that signal delay, coupling effect, power consumption and the like can be reduced. In addition, the lengths of the corresponding conductive wires 181*a* to 181*d* located in different sides of the top chip 130 can be optimized to be equal for the electrical performance by shifting the location and angular position of the top chip 130 above the carrier 110.

FIG. 8 is a schematic three-dimensional view illustrating a chip package structure according to another embodiment of the present invention. Compared to the embodiment of FIG. 1, the pair of first chips 121 of the chip group 120 of the chip package structure 100p of the present embodiment in FIG. 8 is electrically connected to the carrier 110 by flip chip bonding technology. Specifically, the pair of first chips 121 can be disposed and electrically connected to the carrier 110 through a plurality of conductive bumps 190. Moreover, in one embodiment, the pair of first chips 121 are identical IC chips having the same electrical functions, the same dimensions and the same integrated circuits, for example memory chips. Especially, the pair of first chips 121 is disposed on the carrier 110 in opposite directions and in parallel. Thus, the bumps 190 having the same function, such as the signal conductive bumps, would be distributed on different sides of the carrier 130 for connecting to which are the pair of first chips 121. Accordingly, the space over the carrier 110 can be more effectively used.

Referring to FIG. 8 again, similarly, in order to clearly describe the pair of first chips 121 arranged side by side and in opposite directions on the carrier 110, a capital letter "A" is illustrated the direction of each of the pair of first chips 121. According to the directions of the capital letter "A", the pair of first chips 121 include the normal chip 121a located at the right side of FIG. 8 toward the positive direction of the Y axis and the reverse chip 121b located at the left side of FIG. 8 toward the negative direction of the Y axis. In this embodiment, the conductive bumps 190 further includes a plurality of first conductive bumps 190a and a plurality of second conductive bumps 190b. The first conductive bumps 190a are electrically connected to the normal chip 121a and the carrier 110, and the second conductive bumps 190b are electrically connected to the reverse chip 121b and the carrier 110. The orthogonal projection of the first conductive bumps 190a onto the carrier 110 is located at a first side 110a of the carrier 110, and the orthogonal projection of the second conductive bumps 190b onto the carrier 110 is located at a second side 110b opposite to the first side 110a of the carrier 110. The first conductive bumps 190a and the second conductive bumps 190b transmit signals with the same transmission protocol.

FIG. 9 is a schematic three-dimensional view illustrating a chip package structure according to another embodiment of the present invention. Referring to FIG. 9 and cooperating to the embodiment of FIG. 8, the chip group 120 of the chip package structure 100q of the present embodiment further includes a pair of second chips 122. The pair of second chips 122 are electrically connected to the pair of first chips 121 by flip chip bonding technology, and indirectly and electrically connected to the carrier 110 through the pair of first chips 121. In one embodiment, the pair of second chips 122 is electrically connected to the pair of first chips 121 by flip chip bonding technology, and the pair of second chips 122 is electrically connected to the carrier 110 by a through-silicon via (TSV) method through the pair of first chips 121.

Again, in order to clearly describe the pair of second chips 122 arranged side by side and in opposite directions, a capital letter "A" is also shown on each of the pair of second chips 122 in FIG. 9. According to the directions of the capital letter "A", the pair of second chips 122 include the normal chip 122a located at the upper side of FIG. 9 and the reverse chip 122b located at the lower side of FIG. 9.

In this embodiment, the conductive bumps 190 further include a plurality of third conductive bumps 190c and a plurality of fourth conductive bumps 190d. The third conductive bumps 190c are electrically connected to the chip 122a and the carrier 110, and the fourth conductive bumps 190d are electrically connected to the chip 122b and the carrier 110. The orthogonal projection of the third conductive bumps 190c onto the carrier 110 is located at a third side 110c of the carrier 110, and the orthogonal projection of the fourth conductive bumps 190d onto the carrier 110 is located at a fourth side 110d of the carrier 110. The first side 110a is opposite to the second side 110b. The third side 110c is adjacent to an end of the first side 110a, and the fourth side 110d is adjacent to the other end of the first side 110a. The first conductive bumps 190a, the second conductive bumps 190b, the third conductive bumps 190c and the fourth conductive bumps 190d transmit signals with the same transmission protocol.

FIG. 10 is a schematic three-dimensional view illustrating a chip package structure according to another embodiment of the present invention. Referring to FIG. 10 and cooperating to the embodiment of FIG. 9, the chip group 120 of the chip package structure 100r of the present embodiment further includes a top chip 130. The top chip 130 is disposed on the chip group 120 and electrically connected to the carrier 110. In the present embodiment, the top chip 130 would be directly and electrically connected to the carrier 110 through the conductive wires 191. Although it is not shown in the drawings, the top chip 130 would be directly and electrically connected to the first chips 121 and the second chips 122 incorporating with the through-silicon via (TSV) method and the wire bond technology.

FIG. 11 is a schematic three-dimensional view illustrating a chip package structure according to another embodiment of the present invention. Compared to the embodiment of FIG. 10, the top chip 130 of the chip package structure 100s of the present embodiment in FIG. 11 is also disposed on the adjacent pair of second chips 122 and electrically connected to the pair of second chips 122. In the embodiment, the top chip 130 is electrically connected to the pair of second chips 122 by flip chip bonding technology, and indirectly and electrically connected to the carrier 110 through the pair of first chips 121 and the pair of second chips 122. In one embodiment, after the top chip 130 is electrically connected to the pair of second chips 122 by flip chip bonding technology, and the top chip 130 is electrically connected to the carrier 110 by a through-silicon via (TSV) method through the pair of first chips 121 and the pair of second chips 122.

FIG. 12 is a schematic three-dimensional view illustrating a chip package structure according to another embodiment of the present invention. Cooperating with the embodiment of FIG. 8, the chip package structure 100t of the present embodiment in FIG. 12 further includes a plurality of pairs of first chips 121 in two stacks on the carrier 110. The normal chip of the pair of first chips 121 is stacked on and is electrically connected to the normal chip of another pair of first chips 121. The reverse chips of the pairs of first chips 121 are stacked and are electrically connected. In the embodiment, with the benefit on flip chip bonding technology and through-silicon via (TSV) method, each stack is electrically connected through the conductive bumps 190. And, the bottommost pair of first chips 121 is electrically connected to the carrier 110 through the conductive bumps 190.

In the embodiment, the pair of first chips 121 includes the normal chip 121a the reverse chip 121b, the normal chip 121c, the reverse 121d, the normal chip 121e and the reverse chip 121f. The normal chips 121a, 121c and 121e are stacked together, and the reverse chips 121b, 121d and 121f are stacked together. The stack of normal chips and the stack of reverse chips are adjacent but disposed in the opposite direction. The bottommost normal chip 121a and the bottommost reverse chip 121b are connected to the carrier 110 through the conductive bumps 190.

In one embodiment, the above mentioned "the conductive bumps" can also be replaced with "copper pillar", and the electrical connection between the stacked chips can be accomplished by performing the through-silicon via (TSV) technique to the chips 121a, 121b, 121c and 121d.

FIG. 13 is a schematic three-dimensional view illustrating a chip package structure according to another embodiment of the present invention. Referring to FIG. 13 and cooperating to the embodiment of FIG. 12, the chip group 120 of the chip package structure 100u of the present embodiment further includes a plurality of pairs of second chips 122 in two stacks. The two stacks of second chips 122 are adjacent to each other and are disposed on the first chips 121. Each stack of the second chips 122 is electrically connected. In the embodiment, the stacks of the second chips 122 are electrically connected through the conductive bumps 190. Further, the bottommost pair of second chips 122 is electrically connected to the topmost pair of first chips 121 through the conductive bumps 190.

In the embodiment, the pairs of second chips 122 include the chip 122a, the chip 122b, the chip 122c, the chip 122d, the chip 122e and the chip 122f. The chip 122a is adjacent to the chip 122b. Similarly, the chip 122c is adjacent to the chip 122d, and the chip 122e is adjacent to the chip 122f. And, the chips 122a, 122c and 122e are stacked together, and the chips 122b, 122d and 122f are stacked together.

In one embodiment, the above mentioned "the conductive bumps" can also be replaced with "the copper pillar". And, the electrical connection between the stacked chips can be accomplished by performing the through-silicon via (TSV) technique to the chips 121a, 121b, 121c, 121d, 122a, 122b, 122c, and 122d.

Regarding the embodiments of FIG. 1, FIG. 2, FIG. 5, FIG. 6, FIG. 8, FIG. 9, FIG. 12 and FIG. 13 not showing the top chip 130, referring to the embodiments of FIG. 3A, FIG. 3B, FIG. 4, FIG. 7, FIG. 10 and FIG. 11 showing the top chips 130, a top chip can be disposed thereto and the top chip can be electrically connected to the carrier 110 or the chip group 120 located below by wire bonding technology or flip chip bonding technology.

In light of the foregoing, in the present invention, through a pair of first identical chips being disposed on the carrier in opposite directions and parallel to each other, it facilitates the whole chip package structure to reduce the thickness. In addition, through a pair of second identical chips being disposed on the pair of first identical chips in opposite directions and parallel to each other and the pair of second chips relatively inclined to the pair of first chips, it facilitates the whole chip package structure to reduce the thickness, and the dimension of the chip package structure is further reduced.

Furthermore, a top chip can further be disposed on the chips, and when the top chip is electrically connected to the pairs of first and second chips by wire bonding technology, signal delay, coupling effect, power consumption and the like can be reduced through adjusting the lengths of the conductive wires by disposing the chips side by side in opposition directions. Moreover, through the configuration of the first and second chips, the space over the top chip or the carrier can be more effectively used. Through the symmetrical configuration of the top chip and the first and second chips, the time difference of the transmitted signals can be reduced into a minimum range and thus the effect of time difference of the transmitted signals due to the circuit configuration can be reduced or even prevented.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A chip package structure, comprising:
   a carrier; and
   a chip group, comprising:
      a pair of first chips disposed on the carrier and electrically connected to the carrier, wherein the pair of first chips comprises a first normal chip and a first reverse chip, and the first normal chip and the first reverse chip are two identical chips arranged side by side in a plane, each of the identical chips has a plurality of pads at a same side of the corresponding identical chip, one of the identical chips rotated 180 degrees in the plane relative to the other of the identical chips, wherein
      the normal chip has a first end, a second end, a third end and a fourth end, the first end and the third end are opposite, while the second end and the fourth end are opposite, and
      the reverse chip has a first end, a second end, a third end and a fourth end, the first end and the third end are opposite, while the second end and the fourth end are opposite,
      the third end of the normal chip and the third end of the reverse chip are adjacent, the second end of the normal chip and the second end of the reverse chip are located at two opposite ends of the pair of the first chips arranged side by side in the plane respectively, and
      each of the identical chips only has a plurality of pads that are located at the fourth end of the corresponding identical chip.

2. The chip package structure as claimed in claim 1, wherein the chip package structure further comprises:
   a plurality of first conductive wires electrically connecting the first normal chip and the carrier, wherein an orthogonal projection of the first conductive wires onto the carrier is located in a first side of the carrier; and
   a plurality of second conductive wires electrically connecting the first reverse chip and the carrier, wherein an orthogonal projection of the second conductive wires onto the carrier is located in a second side of the carrier, the first conductive wires and the second conductive wires are used to transmit same signals, and the first side is opposite to the second side.

3. The chip package structure as claimed in claim 1, wherein the pair of first chips is chips having the same function.

4. The chip package structure as claimed in claim 1, wherein the chip group comprises:
   a second pairs of first chips, wherein the first normal chip of the second pair of first chips is stacked on and is electrically connected to the first normal chip of the pair of first chips, and the first reverse chip of the second pair of first chips is stacked on and is electrically connected to the first reverse chip of the pair of first chips.

5. The chip package structure as claimed in claim 4, wherein the second pair of first chips is electrically connected to the pair of first chips by a plurality of conductive wires.

6. The chip package structure as claimed in claim 1, wherein the chip group further comprises:
   a pair of second chips disposed on the pair of the first chips and electrically connected to the carrier, wherein the pair of second chips comprises a second normal chip and a second reverse chip disposed in opposite directions, and the second normal chip and the second reverse chip are other two identical chips arranged side by side with one of the other identical chips reversed, wherein a longitudinal direction of the pair of first chips and a longitudinal direction of the pair of second chips are not parallel.

7. The chip package structure as claimed in claim 6, wherein the longitudinal direction of the pair of first chips is orthogonal to the longitudinal direction of the pair of second chips onto the carrier.

8. The chip package structure as claimed in claim 6, wherein the chip package structure further comprises:
   a plurality of first conductive wires electrically connecting the first normal chip and the carrier, wherein an orthogonal projection of the first conductive wires onto the carrier is located in a first side of the carrier;
   a plurality of second conductive wires electrically connecting the first reverse chip and the carrier, wherein an orthogonal projection of the second conductive wires onto the carrier is located in a second side of the carrier;
   a plurality of third conductive wires electrically connecting the second normal chip and the carrier, wherein an orthogonal projection of the third conductive wires onto the carrier is located in a third side of the carrier; and
   a plurality of fourth conductive wires electrically connecting the second reverse chip and the carrier, wherein an orthogonal projection of the fourth conductive wires onto the carrier is located in a fourth side of the carrier, wherein the first side is opposite to the second side, the third side is adjacent to an end of the first side, and the fourth side is adjacent to the other end of the first side.

9. The chip package structure as claimed in claim 6, wherein the chip group further comprises:
   a second pair of second chips stacked on the pair of second chips and electrically connected to the pair of second chips, wherein the second normal chip of the second pair of second chips is stacked on and is electrically connected to the second normal chip of the pair of second chips, and the second reverse chip of the second pair of second chips is stacked on and is electrically connected to the second reverse chip of the pair of second chips.

10. The chip package structure as claimed in claim 9, wherein the pair of second chips and the second pair of second chips are electrically connected by a plurality of conductive wires.

11. The chip package structure as claimed in claim 1, further comprising:
   a top chip disposed on the chip group and electrically connected to the chip group.

12. The chip package structure as claimed in claim 11, wherein the top chip electrically connected to the carrier.

13. The chip package structure as claimed in claim 11, wherein the top chip is electrically connected to the chip group by a plurality of conductive wires.

14. The chip package structure as claimed in claim 13, wherein lengths of conductive wires located at two opposite sides of the top chip are substantially identical.

15. The chip package structure as claimed in claim 11, wherein the top chip is electrically connected to the chip group by flip chip bonding technology.

16. The chip package structure as claimed in claim 11, wherein the pair of first chips is memory chips, and the top chip is embedded with a memory controller.

17. The chip package structure as claimed in claim 4, wherein all of the plurality of pads are located on an upper surface of the first normal chips and the first reverse chips of the pair of the first chips and the second pair of the first chips.

18. The chip package structure as claimed in claim 6, wherein all of plurality of pads are located on an upper surface of the first normal chip, the first reverse chip, the second normal chip and the second reverse chips.

* * * * *